United States Patent [19]
Shepston

[11] Patent Number: 6,094,089
[45] Date of Patent: Jul. 25, 2000

[54] CURRENT LIMITING RECEIVER WITH IMPEDANCE/LOAD MATCHING FOR A POWERED DOWN RECEIVER CHIP

[75] Inventor: Shad R. Shepston, Loveland, Colo.

[73] Assignee: Hewlett-Packard Company, Palo Alto, Calif.

[21] Appl. No.: 09/036,035

[22] Filed: Mar. 6, 1998

[51] Int. Cl.[7] ...................................................... H03K 3/01
[52] U.S. Cl. ........................... 327/534; 327/537; 327/546
[58] Field of Search .................................... 327/534, 537, 327/546

[56] References Cited

U.S. PATENT DOCUMENTS

| | | | |
|---|---|---|---|
| 5,338,978 | 8/1994 | Larsen et al. | 307/443 |
| 5,406,140 | 4/1995 | Wert et al. | 326/68 |
| 5,448,198 | 9/1995 | Toyoshima et al. | 327/530 |
| 5,610,550 | 3/1997 | Furutani | 327/543 |
| 5,821,796 | 10/1998 | Yaklin et al. | 327/313 |

*Primary Examiner*—Toan Tran
*Assistant Examiner*—Quan Tra

[57] ABSTRACT

The inventive mechanism prevents current flow from the drain to the source and substrate, in a power off condition of a p-type FET. The current flow from the drain to the substrate is prevented by raising the voltage required to turn on the diodes that are formed when the power is off. This is accomplished by having the substrate gate connected to a series of diodes formed from other pFET devices. The combined threshold voltage of the series exceeds a voltage associated with the current. The current flow from the drain to the source is prevented by pinching off the channel of the pFET during a power off condition. Since a high signal is required to turn off a pFET device and the power to the pFET is off, an off chip voltage associated with the current is used to turn off the pFET. A current sink FET is used to prevent reflections by supplying the proper impedance to receive the off chip signal associated with the current.

46 Claims, 3 Drawing Sheets

CURRENT LIMITING RECEIVER WITH IMPEDANCE/LOAD MATCHING FOR A POWERED DOWN RECEIVER CHIP

BACKGROUND OF THE INVENTION

The field effect transistor (FET) is a three terminal device in which the current through two terminals is controlled by the voltage at the third terminal. FETs are used in many electronic devices, from computer systems to communications systems. FETs can be divided into two main classes, n-type and p-type. n-type or p-type refers to the doping type of the channel region. Thus, a p-type FET or pFET comprises p-type source region, drain region, and channel, and n-type gate regions.

In some applications, the drain signal will originate from a chip that is different from the origination of the source and gate signals. For example, the FET may be located on a receiver chip, and is the intended termination of signals from a driving chip. Thus, it will sink a certain amount of current, depending on the voltage of the incoming signal VM. Since the signals may be on different chips, the FET power signal may be off, while the driving signal may be on. This can cause problems for both the FET resident, receiving chip and the driving chip.

An schematic example of a pFET is shown in FIG. 4A. A physical arrangement of a PFET is shown in FIG. 4B. FET 40 includes source 41 connected to VDL, drain 42 connected to VM, control gate 45 which is connected to a control signal, here GND, and substrate gate 43 which is tied to VDL. Substrate gate 43 could be an n-well in a p-type substrate, or it could be a portion of a n-type substrate. In operation, FET 40 uses a p-type channel 44, which is controlled by control gate 45. When control gate 45 is at ground, channel 44 is open and allows current to flow. When gate 45 has voltage greater than source 41 minus the pFET threshold voltage, then channel 44 is pinched off and current flow from source 41 to drain 42 is prevented. Thus, gate 45 controls the flow of current by application of the voltage in the gate signal.

A problem occurs when the resident chip of FET 40 loses power, and VDL at source 41 drops to ground. When this occurs, a pn diode is formed between drain 42, which is p-type, and n-type substrate gate 43. Drain 42 receives VM which is the signal from the driving chip. If VM is a positive voltage of greater than approximately 0.7volts, or the threshold activation voltage of the pn diode, then the pn diode turns on and sinks a large amount of current from source 42 to substrate gate 43. This occurs because the substrate is no longer biased at the power supply voltage, it is now held at ground.

Note that the diode provides a very low resistance path to ground, thus this appears to be a short circuit to the driving chip from a transmission perspective. If the VM signal is not terminated with the correct impedance, it will cause a reflection wave back to the driving chip, at nearly full value of voltage. Since the diode appears as a short circuit, the reflection signal will reflect back with a negative or inverse wave (an open circuit would reflect a positive wave). The negative wave could cause interference, either constructive or destructive, depending upon the phases of the signals. Constructive interference may result in a signal that exceeds the capabilities of the driving chip and damage the chip, whereas destructive interference may result in degradation of the signal sent to the receiving chip.

The large amount of current flow causes the driving chip to have to supply a lot of current. Moreover, the large current generates a large amount of heat in both the driving chip and the receiving chip. The current flow to the receiving chip could also charge up the substrate of the receiving chip, as if the receiving chip were a capacitor. During power up of the receiving chip, or otherwise grounding the charged substrate, the stored current would discharge and may damage the receiving chip.

Current also flows from VM to VDL. When VDL is at power off ground, and gate 45 is also at ground, then FET 40 is still in the saturation region and current flows through the source to ground from the drain, as channel 44 is still open. So this is another current flowing through the FET when the power is down on the receiving chip. Moreover, this additional current must also be provided by the driving chip. Note that this current flow will also cause signal reflection, as the current flow will result in improper impedance matching, and hence reflection.

Both current sinking mechanisms, i.e. the draining from the pn diode and the drain through the channel, together draw approximately 1.6 amps. This is much larger than the normal power up driving current of 72 ma. Thus, a power off condition of the receiving chip places a very tough current demand for the driving chip power supplies to meet.

Note that the problems described herein only occur with a pFET, and not a nFET. With a nFET, a np diode would be formed, which will not turn on from a voltage at the drain. Moreover, the gate of the nFET would have to be connected to VDL in order for the nFET channel to be open, and upon power loss would go to ground, and thus pinch off the channel.

Therefore, there is a need in the art for a mechanism which will prevent current flow from the drain to the source and substrate, in a power off condition of a p-type FET.

SUMMARY OF THE INVENTION

These and other objects, features and technical advantages are achieved by a system and method which prevents current flow from the drain to the source and substrate, in a power off condition of a p-type FET. The inventive mechanism has three aspects, one aspect to control the current drain to the substrate, another aspect to control the current drain to the source, and third to prevent driving signal reflection.

The first aspect raises the voltage required to turn on the diode. If the threshold voltage exceeds the maximum VM voltage, then the diode will never turn on, and no current will be sinked from the drain through the substrate. This is accomplished by having the substrate gate connected to a series of diodes formed from other pFET devices, instead of tied to the VDL power supply. The other pFET devices are connected to VDL such during the power on condition, the substrate gate is connected to VDL. In a power off condition, the substrate gate is then connected to ground via a series of pn diodes, whose combined threshold voltage exceeds the maximum expected VM voltage.

The second aspect shuts off the receiving FET and pinches off the channel. If the channel is pinched off, then no current can flow through the channel and no current will be sinked from the drain to the source through the channel. This is accomplished by pulling up the gate voltage of the FET from ground. Note that p-type FETs require the gate to be grounded to operate. The gate of the FET is connected to voltage provided by another circuit, instead of being tied to ground. The circuit would provide a ground signal during a normal power on condition. In a power off condition, the circuit provides the signal of VM to the gate, thus the gate will be at a voltage equal to the drain and greater than ground, and thus pinch off the channel and prevent current from flowing to the source through the channel.

If the first two aspects are implemented, and thus no current flows to the receiving chip, then the receiving chip appears as open circuit to the driving chip. This will cause a reflection wave back to the driving chip, at nearly full value of voltage. Since the chip appears as an open circuit, the reflection signal will reflect back with a positive wave. The positive wave could cause interference, either constructive or destructive, depending upon the phases of the signals. Constructive interference may result in a signal that exceeds the capabilities of the driving chip and damage the chip, whereas destructive interference may result in degradation of the signal sent to the receiving chip.

Thus, the third aspect of the inventive mechanism provides the proper impedance to prevent reflection upon a power off condition. If the driving chip sees the proper impedance, then no reflections of the signal will be sent back to the driving chip. This is accomplished by providing an pFET which is turned off during a normal power on condition. In a power off condition, the pFET provides sink for the current of the VM signal. The pFET is preselected so as to provide an approximate impedance match for an expected voltage range of VM. Thus, the pFET greatly reduces the amount of reflection of the VM signal.

A technical advantage of the present invention is undesired current is prevented from flowing into the FET device.

Another technical advantage of the present invention is that current flowing through the drain into the substrate of a p-type FET is prevented from flowing during a power off condition of the FET.

A further technical advantage of the present invention is that current flowing through the channel into the source of a p-type FET is prevented during a power off condition of the FET.

A further technical advantage of the present invention is that reflections from impedance mismatch during a power off condition of a receiving chip are reduced.

A further technical advantage of the present invention provides a reliable signal termination in a communications link on a signal receiving chip using a p-type FET.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
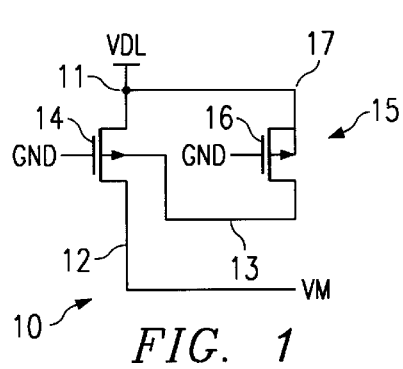
FIG. 1 depicts a simplified view of the inventive circuit for preventing current from flowing from the drain into the substrate of a p-type FET.
Figure 3:
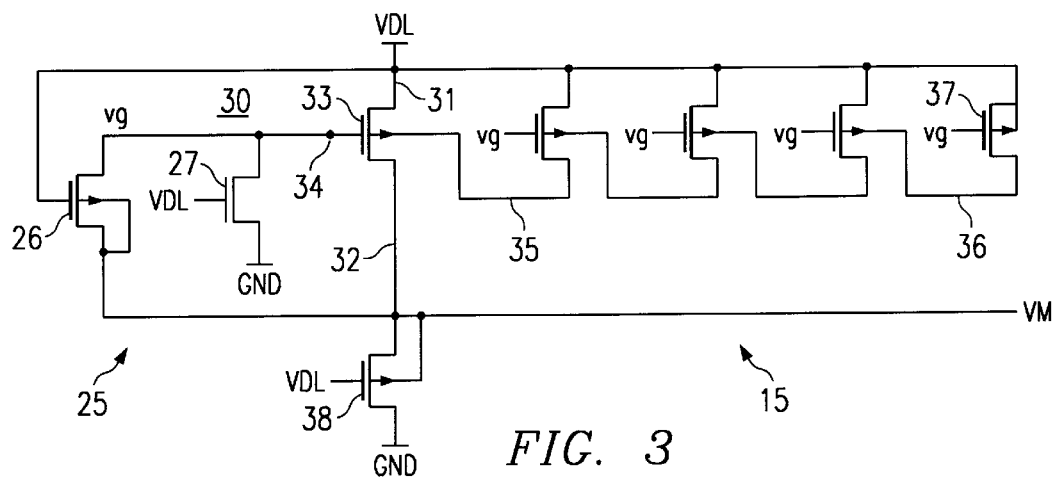
FIG. 3 depicts an expanded circuit of FIG. 1 operating in combination with the circuit of FIG. 2 to prevent undesired current from flowing in a p-type FET.
Figure 4A:
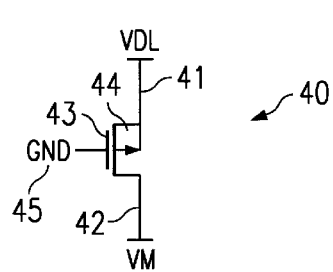
FIGS. 4A and 4B depict a prior art arrangement of a p-type FET.
Figure 4B:
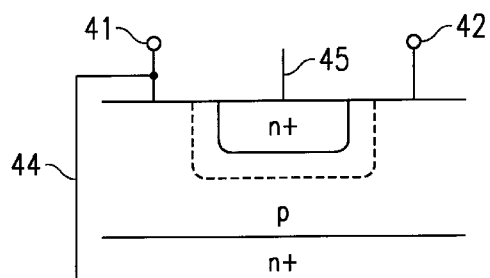

FIG. 1 depicts a simplified version of the inventive circuit mechanism 15 that prevents current from flowing from drain 12 into the substrate 13 of a p-type FET 10. As shown in FIG. 1, mechanism 15 comprises a single FET, however additional FETs could be used as needed. For example, if the maximum expected voltage of VM 12 is less than 1.4 volts then a total of two pn diode are needed (assuming each diode has a threshold voltage of 0.7v), and thus only the two pFETs as shown in FIG. 1 are required to provide the pn diodes in a power off condition. A higher voltage would require additional diodes, and hence additional pFETs, this arrangement is shown in FIG. 3.

In FIG. 1 the n well or substrate gate 13 of pFET 10 is connected to the drain of pFET 15, and is not directly connected to the power supply VDL. In a power on condition, substrate gate 13 is connected to VDL via pFET 15. pFET 15, has its control gate tied to ground and is always turned on, and thus passes the VDL signal from source 17 to its drain, which is connected to substrate gate 13 or pFET 10. In a power off condition, substrate gate 13 is then connected to ground via a pn diode formed from the drain and substrate gate 16 of pFET 15. Thus, the diode formed of drain 12 and substrate gate 13 of pFET 10 is connected in series with the diode formed in pFET 15. In order for any current to be sinked through substrate gate 13, the VM must exceed the threshold voltage for the two diodes, which is approximately 0.7v for each in series, for a total of 1.4v. More diodes could be used as needed, depending upon the voltage of VM.

Figure 5A:
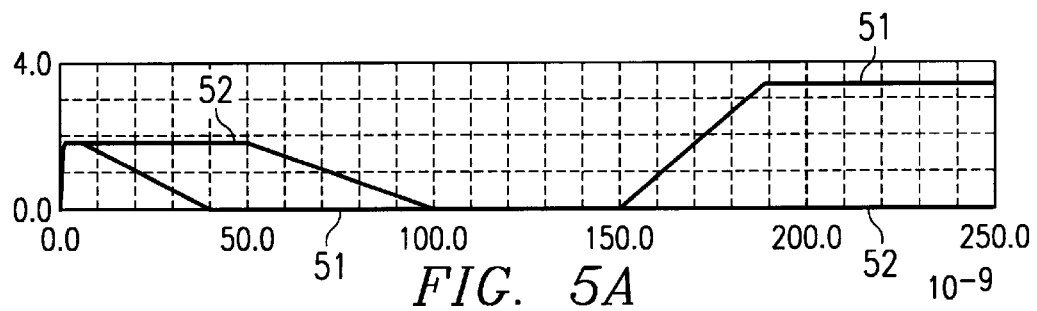
FIGS. 5A, 5B, 5C, and 5D depict the performance aspects of the circuits of FIGS. 1, 2, and 3.
Figure 5B:
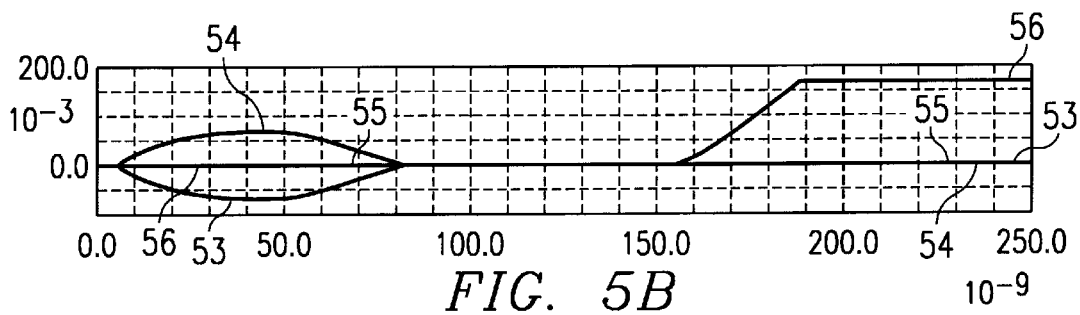
Figure 5C:
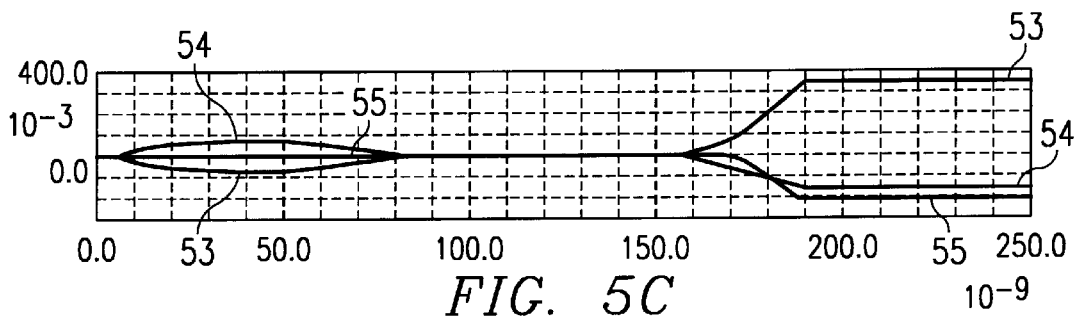

FIG. 5A depicts the voltages at VM 51 and VDL 52 at different times. The y-axis is the voltage axis, expressed in volts. The x-axis is the time axis, expressed in picoseconds. FIG. 5C depicts the effects of the pFET 15 on pFET 10. The y-axis is the current axis, expressed in milliamps. The x-axis is the time axis, expressed in picoseconds. The time section prior to 50 picoseconds represents the normal power on operation, i.e. with VDL 52 at approximately 1.8v, and source 54 and drain 53 currents at approximately +72 ma and approximately −72 ma, respectively. At 50 picoseconds, the chip is powered down and VDL begins to go to zero. The source and drain currents also begin to move to zero. At 150 picoseconds, VM increases from zero while VDL remains at zero. At approximately 200 picoseconds, substrate gate current 55 is approximately −200 ma. Substrate gate current 55 represents the current flowing through the pn diode formed in pFET 10, from drain 12 and substrate gate 13. Thus, by adding a single pFET, the current has dropped from approximately −1.6 a to approximately −200 ma, because of the resistances of the two pn diodes. The current of approximately −1.6 a can be seen in FIG. 5D, which depicts the effects of circuit of FIG. 2, which lacks the diode from pFET 15 in FIG. 1. Since the substrate gate current 55 has not been reduced to zero, additional pn diodes need to be included in the circuit of FIG. 1.

FIG. 5C also depicts source current 54 at approximately −155 ma at 200 picoseconds. This current represents the current that flows into source 11 through channel 14 of pFET 10. The circuit of FIG. 1 cannot reduce this current as pFET 10 is in the saturation region. Note that this current is approximated twice the normal operating current of 72 ma. Drain current 53 represents the total current flowing into pFET 10, i.e. the sum of source current 54 and substrate gate current 55.

Figure 2:
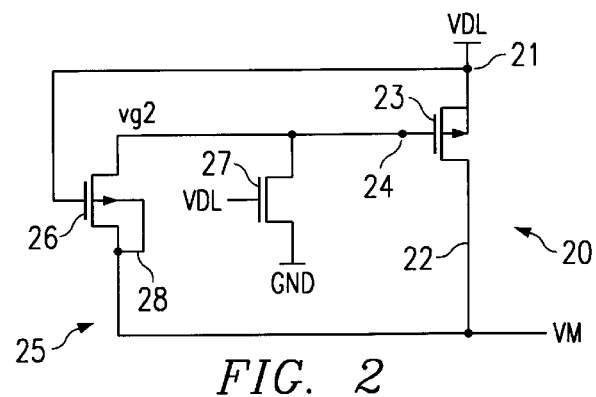
FIG. 2 depicts the inventive circuit for preventing current from flowing from the drain to the source of a p-type FET.

FIG. 2 depicts the inventive circuit mechanism 25 that prevents current from flowing from drain 22 to source 21 via channel 23 of p-type FET 20. As shown in FIG. 2, mechanism 25 comprises two FETs 26, 27 connected to pFET 20. The two FETs 26,27 provide a ground voltage to control gate 24 of pFET 20 during normal power on conditions, and during a power off condition, provide the signal VM voltage to the control gate 24. This will pinch off channel 23 of pFET 20, so that no current can flow through the channel, and thus, no current can be sinked from drain 22 to source 21.

In FIG. 2, control gate 24 of pFET 20 is connected to the sources of FETs 26,27, and is not connected directly to ground. In a power on condition, control gate 24 must be at ground. This is accomplished by FET 25, which is a n-type FET. The gate control of FET 27 is tied to the power supply VDL, and thus FET 27 is turned on when power is on, and passes the ground signal from the drain to the source, and thus to gate control 24 of pFET 20. FET 26 is a p-type FET, with its control gate tied to VDL, and thus is turned off when the power supply is on. So in normal operating conditions VDL is high, which turns on FET 27, which pulls control gate 24 down to ground. In a power off condition, control gate 24 must be at a voltage higher than the drain voltage minus the pFET threshold voltage. Since the receiving chip is in a powered down condition, an off chip voltage signal must be used. As the VM signal is from the driving chip, then this voltage can be used to turn off pFET 20. This is facilitated by FET 26, which is a p-type FET. The gate control of FET 26 also is tied to the power supply VDL, and thus FET 26 is turned on when power is off and VDL is at ground. Note that the substrate gate or n-well 28 of FET 26 is tied to VM. In a power off condition, VM will be the highest voltage, and thus for FET 26 to operate normally, the substrate gate must be connected to the power supply, which by default is VM. FET 26 then passes the VM signal from the drain to the source, and thus to gate control 24 of pFET 20. FET 27 is a n-type FET, with its control gate tied to VDL, and thus is turned off when the power supply is off. So in power off operating conditions VDL is low, which turns on FET 26, which pulls control gate 24 up to VM, and turns pFET 20 off, thus preventing any current from flowing through channel 23.

Figure 5D:
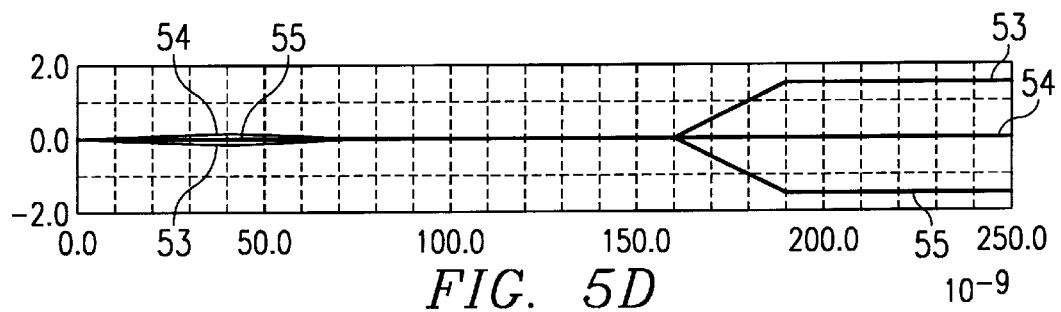

As described above, FIG. 5A depicts the voltages at VM 51 and VDL 52 at different times. FIG. 5D depicts the effects of the FETs 26, 27 on pFET 20. The y-axis is the current axis, expressed in amps. The x-axis is the time axis, expressed in picoseconds. The time section prior to 50 picoseconds represents the normal power on operation, i.e. with VDL 52 at approximately 1.8v, and source 54 and drain 53 currents at approximately +72 ma and approximately −72 ma, respectively. Note that this portion is the same for FIGS. 5B, 5C, and 5D, but looks different because the y-axis scaling is different. Again, at 50 picoseconds, the chip is powered down and VDL begins to go to zero. At 150 picoseconds, VM increases from zero while VDL remains at zero. At approximately 200 picoseconds, source current 54 is at approximately zero amps. This current represents the current that flows into source 21 through channel 23 of pFET 20. As compared to FIG. 5C, which represents the circuit of FIG. 1 which lacks the circuit of FIG. 2, this current has been reduced from −155 ma to zero.

FIG. 5D also depicts substrate gate current 55 at approximately −1.6 a. Substrate gate current 55 represents the current flowing through the pn diode formed in pFET 20, from drain 22 and substrate gate. Thus, by not including the circuit of FIG. 1, the current is approximately 1.6 a as compared with approximately −200 ma. Drain current 53 represents the total current flowing into pFET 20, i.e. the sum of source current 54 and substrate gate current 55.

FIG. 3 depicts the inventive circuit mechanisms 15, 25 of FIGS. 1 and 2, preventing current from flowing into pFET 30. The mechanism 15 prevents current from flowing from drain 32 into the substrate 33 of a p-type FET 30. The mechanism 25 prevents current from flowing from drain 32 into source 31 of pFET 30.

As shown in FIG. 3, mechanism 15 comprises a plurality of p-type FETs, each forming a diode from there respective drains and substrates in a power off condition. The drains and substrates of the FETs are connected such that the formed diodes are connected in series. The drain of the first FET 35 is connected to substrate 33 of pFET 30. The substrate 37 of the last FET 37 is connected to VDL. The sources of each of the FETs are connected to VDL. Note that control gate 30, as well as the control gates of the FETs 15 are connected to VG, which is provided by FETs 26,27. In a normal, power on condition, substrate gate 33 is pulled up to VDL. With VDL high, FET 26 is off, and FET 27 is on. Thus, FET 27 connects VG to ground. This turns on pFET 30, and FETs 15. First FET 35 pulls substrate gate 33 to VDL. Therefore, pFET 30 will operate normally.

In a power off condition, substrate gate 33 is then connected to VDL which is now at ground, via a series of pn diodes are formed from respective drains and substrate gates of each of FETs 15. In a power off condition, VDL is low, FET 27 is off and FET 26 is on. Thus, FET 27 connects VG to VM. This turns off pFET 30, and FETs 15. Thus the current path is from drain 32 to substrate gate 33, to the drain of the first FET 35 to the substrate gate of FET 35, to the drain of the next FET, and so on, until substrate gate 37 of the last FET 36, which is connected to VDL now at ground. This chain forms a series of pn diodes. Thus, for any current to be sinked through substrate gate 33, the VM must exceed the threshold voltage for the diode series, which is approximately 0.7v for each diode in the series. In FIG. 3, there are a total of 5 diodes for a total threshold voltage of 3.5v. Thus, VM must exceed 3.5v for any current to flow.

More diodes could be used as needed, depending upon the voltage of VM. Furthermore, a circuit could be included which will switch additional FETs into the series connection as needed. Thus, the precise quantity of voltage of VM does not have to be predetermined in building the receiving chip. The receiving chip could be made flexible in the amount of voltage that it can receive from the driving chip.

In a power off condition, VDL is low, FET 27 is off and FET 26 is on. Thus, FET 26 connects VG to VM. This turns off pFET 30, and FETs 15. Note that FETs 15 are turned off in addition to pFET 30. This prevents any current from flowing through their channels to their sources, and on to VDL at ground.

As described above, FIG. 5A depicts the voltages at VM 51 and VDL 52 at different times. FIG. 5B depicts the effects of the FETs 15, 26, 27 on pFET 30. The y-axis is the current axis, expressed in milliamps. The x-axis is the time axis, expressed in picoseconds. The time section prior to 50 picoseconds represents the normal power on operation, i.e. with VDL 52 at approximately 1.8v, and source 54 and drain 53 currents at approximately +72 ma and approximately −72 ma, respectively. Note that this portion is the same for FIGS. 5B, 5C, and 5D, but looks different because the y-axis scaling is different. Again, at 50 picoseconds, the chip is powered down and VDL begins to go to zero. At 150 picoseconds, VM increases from zero while VDL remains at zero. At approximately 200 picoseconds, source current 54 is at approximately zero milliamps. This current represents the current that flows into source 21 through channel 33 of pFET 30. Also substrate gate current 55 at approximately zero milliamps. Substrate gate current 55 represents the current flowing through the pn diode formed in pFET 30, from drain 32 and substrate gate 33. Consequently, drain current 53, which represents the total current flowing into pFET 30 or the sum of source current 54 and substrate gate current 55, is approximately zero milliamps.

FIG. 3 also includes resistor FET 38. This p-type FET provides an approximate impedance match for the VM signal. If no current is flowing into pFET 30, then the connection to the pFET appears as an open to the driving chip, and signal reflection will occur. FET 38 provides a sink for the current with a suitable impedance. The impedance of the FET 38 is preselected to provide an approximate impedance match for an expected voltage range of the VM signal from the driving chip. The control gate of FET 38 is connected to VDL so that in normal power on conditions, this FET is turned off. In a power off condition, VDL goes to ground, and FET 38 turns on, and provides a path for VM to ground. The signals are terminated at FET 38 and not reflected back to the driving chip. Note that the FET 38 will provide a linear current for a particular voltage. Thus, FET 38 can be selected to sink a particular amount of current, however, it will not track over the complete range of VM. This will greatly reduce the amount of reflection.

FIG. 5B includes a measure of source current 56 of FET 38. Note that the source current 56 is substantially linear with respect to VM 51. A period of non-linearity is present between 150 and 155 picoseconds. The non-linearity is due to a threshold voltage that VM must overcome, before FET 38 begins to operate.

Figure 6A:
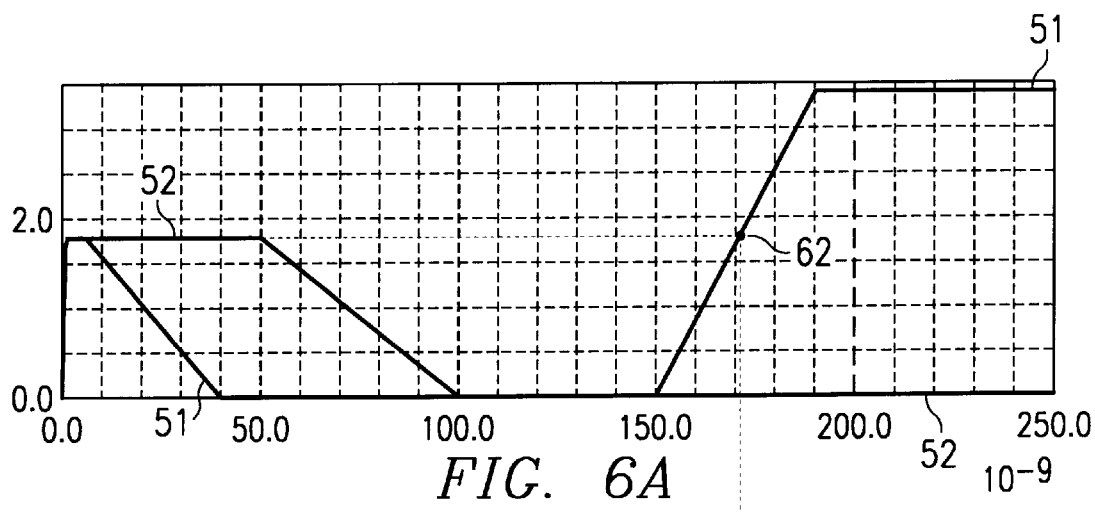
FIGS. 6A and 6B depict the performance aspects of the circuit of FIG. 3.
Figure 6B:
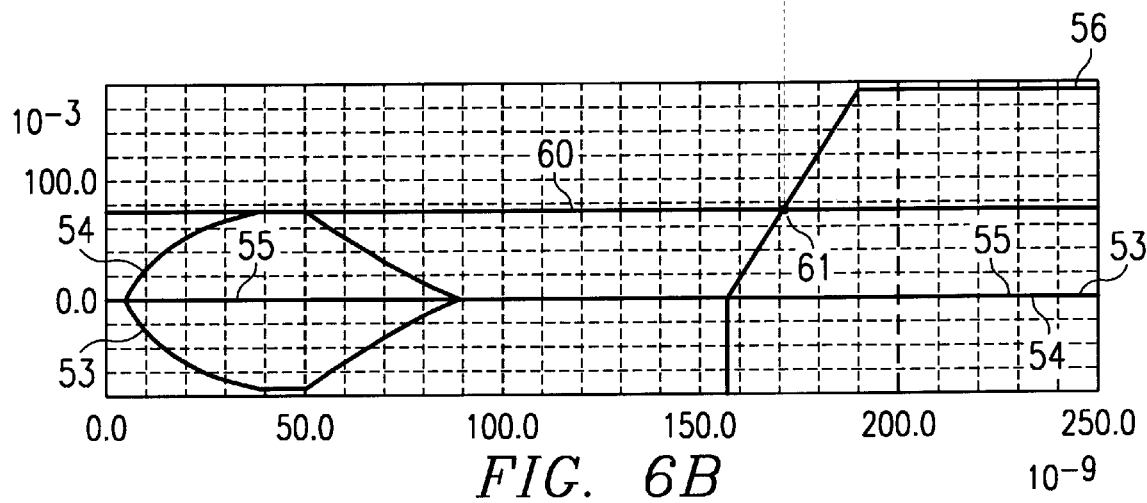

FIG. 6A is similar to FIG. 5A. FIG. 6B is similar to FIG. 5B, but includes reference line 60 which defines the normal operating current of pFET 30. The intersection 61 of reference line 60 and rFET source current 56, marks the point at which the current through rFET 38 matches the normal operating current of pFET 30. The current of the rFET 38 is from the VM signal, and thus the corresponding point 62 (in time) on VM voltage 51 is at approximately 1.8 volts which matches the normal operating voltage VDL 52. Therefore, the impedance of rFET 38, when rFET 38 is operating at points 61 and 62, is the same as pFET under normal power on conditions.

Note that the characteristics depicted in FIGS. 5A–5D and 6A–6B are for purposes of illustration only, as the precise operating conditions and characteristics depend on the specific devices being used.

Although the present invention and its advantages have been described in detail, it should be understood that various changes, substitutions and alterations can be made herein without departing from the spirit and scope of the invention as defined by the appended claims.

What is claimed is:

1. A system for controlling an amount of a current flowing from a first terminal of a first device into a substrate of the first device, wherein a second terminal of the first device is connected to a power supply, the system comprising:

a mechanism including a first terminal that is connected to the substrate of the first device, and a second terminal that is connected to the second terminal of the first device;

wherein if the power supply is off, the first terminal of the first device and the substrate of the first device form a first diode, the first terminal of the mechanism and a substrate of the mechanism are elements of at least one diode which is in a series with the first diode, and a threshold voltage of the series exceeds a voltage associated with the current, and prevents the current from flowing;

wherein the mechanism includes a plurality of devices arranged in a series circuit, the series includes a first device of the series circuit includes the first terminal of the mechanism, and the remainder of the devices of the series circuit each include a terminal which is connected to a substrate of the preceding adjacent device of the series circuit, and the last device in the series circuit includes the substrate of the mechanism, and the remainder of the devices of the series circuit each include a substrate which is connected to a terminal of the subsequent adjacent device of the series circuit.

2. The system of claim 1, wherein:

the mechanism connects the power supply to the substrate of the first device when the power supply is on which allows the current to flow.

3. The system of claim 1, wherein:

the current originates from a first chip that is remote from a second chip which includes the first device.

4. The system of claim 3, further comprising:

a second device including a first terminal that is connected to ground, and a second terminal that is connected to the first terminal of the first device;

wherein if the power supply is off, the second device terminates the current.

5. The system of claim 4, wherein:

the second device has an impedance that approximately matches an impedance of the first device when the power supply is on.

6. The system of claim 1, wherein:

the first device and the mechanism comprise p-type field effect transistors.

7. A system for controlling an amount of a current flowing from a first terminal of a first device into a substrate of the first device, wherein a second terminal of the first device is connected to a power supply, the system comprising:

means for forming at least one pn diode in series with a pn diode formed from the first terminal of the first device and the substrate of the first device when the power supply is off, wherein a threshold voltage of the series exceeds a voltage associated with the current and prevents the current from flowing; and means for connecting the power supply to the substrate of the first device when the power supply is on and allowing the current to flow;

wherein the means for forming at least one pn diode includes a plurality of devices arranged in a series circuit, the series circuit includes a first device of the series circuit includes a terminal which is connected to the substrate of the first device, and the remainder of the devices of the series circuit each include a terminal which is connected to a substrate of the preceding adjacent device of the series circuit, and the last device in the series circuit includes a substrate which is connected to the power supply, and the remainder of the devices of the series circuit each include a substrate which is connected to a terminal of a subsequent adjacent device of the series circuit; and wherein each of the devices forms a pn diode from its respective terminal and substrate.

8. The system of claim 7, wherein:

the current originates from a first chip that is remote from a second chip which includes the first device.

9. The system of claim 8, further comprising:

means for terminating the current when the power supply is off.

10. The system of claim 9, wherein:

the means for terminating the current has an impedance that approximately matches an impedance of the first device when the power supply is on.

11. The system of claim 7, wherein:

the first device and the means for forming at least one pn diode comprise p-type field effect transistors.

12. A system for controlling an amount of a current flowing from a first terminal of a first device to a second terminal of the first device through a channel of the first device, wherein the second terminal of the first device is connected to a power supply, the system comprising:

a second device including a first terminal that is connected to a ground common to the first and second device, a second terminal that is connected to a control gate of the first device, and a control gate that is connected to the power supply; and a third device including a first terminal that is connected to the first terminal of the first device, a second terminal that is connected to the second terminal of the second device, and a control gate that is connected to the power supply;

a fourth device including a first terminal that is connected to ground, and a second terminal that is connected to the first terminal of the first device;

wherein if the power supply is on, the control gate of the third device turns the third device off, the control gate of the second device turns the second device on which brings the control gate of the first device to ground and turns the first device on, thereby allowing the current to flow; and wherein if the power supply is off, the control gate of the second device turns the second device off, the control gate of the third device turns the third device on which brings the control gate of the first device to a voltage associated with the current and turns the first device off, thereby preventing the current from flowing; and wherein if the power supply is off, the fourth device terminates the current.

13. The system of claim 12, wherein:

the control gate of the third device turns the third device off by pinching off a channel of the third device;

the control gate of the second device turns the second device off by pinching off a channel of the second device; and the control gate of the first device turns the first device off by pinching off the channel of the first device.

14. The system of claim 12, wherein:

the control gate of the third device turns the third device on by opening a channel of the third device;

the control gate of the second device turns the second device on by opening a channel of the second device; and the control gate of the first device turns the first device on by opening the channel of the first device.

15. The system of claim 12, wherein:

the current originates from a first chip that is remote from a second chip which includes the first device.

16. The system of claim 15, wherein:

the fourth device has an impedance that approximately matches an impedance of the first device when the power supply is on.

17. The system of claim 12, wherein:

the first device, the third device comprise p-type field effect transistors; and the second device comprises a n-type field effect transistor.

18. A system for controlling an amount of a current flowing from a first terminal of a first device to a second terminal of the first device through a channel of the first device, wherein the second terminal of the first device is connected to a power supply, the system comprising:

means, operable if the power supply is on, for bringing a control gate of the first device to ground which turns the first device on, thereby allowing the current to flow;

means, operable if the power supply is off, for bringing the control gate of the first device to a voltage associated with the current which turns the first device off, thereby preventing the current from flowing; and means for terminating the current when the power supply is off.

19. The system of claim 18, wherein:

the control gate of the first device turns the first device off by pinching off the channel of the first device.

20. The system of claim 18, wherein:

the control gate of the first device turns the first device on by opening the channel of the first device.

21. The system of claim 18, wherein:

the current originates from a first chip that is remote from a second chip which includes the first device.

22. The system of claim 21, wherein:

the means for terminating the current has an impedance that approximately matches an impedance of the first device when the power supply is on.

23. The system of claim 18, wherein:

the first device, and the means for bringing the control gate of the first device to a voltage associated with the current comprise p-type field effect transistors; and the means for bringing the control gate of the first device to ground comprises a n-type field effect transistor.

24. A system for controlling an amount of a current flowing from a first terminal of a first device, wherein the device includes a control gate, a substrate, a channel, and a second terminal which is connected to a power supply, the system comprising:

a mechanism including a first terminal that is connected to the substrate of the first device, a control gate that is connected the control gate of the first device, and a second terminal that is connected to the second terminal of the first device;

a second device including a first terminal that is connected to a ground common to the first and second device, a second terminal that is connected to the control gate of the first device, and a control gate that is connected to the power supply; and a third device including a first terminal that is connected to the first terminal of the first device, a second terminal that is connected to the second terminal of the second device, and a control gate that is connected to the power supply;

wherein if the power supply is off, the control gate of the second device turns the second device off, the control gate of the third device turns the third device on which brings the control gate of the first device to a voltage associated with the current and turns the first device off, thereby preventing the current from flowing from the first terminal of the first device to the second terminal of the first device through the channel of the first device;

wherein if the power supply is off, the control gate of the second device turns the second device off, the control gate of the third device turns the third device on which brings the control gate of the mechanism to a voltage associated with the current and turns the mechanism off, and the first terminal of the first device and the substrate of the first device form a pn diode, the first terminal of the mechanism and the substrate of the mechanism are elements of at least one diode which is in a series with the first diode, and a threshold voltage of the series exceeds a voltage associated with the current, and prevents the current from flowing from the first terminal of the first device into the substrate of the first device, wherein if the power supply is on, the control gate of the third device turns the third device off, the control gate of the second device turns the second device on which brings the control gate of the first device to ground and turns the first device on, thereby allowing the current to flow from the first terminal of the first device to the second terminal of the first device through the channel of the first device;

wherein if the power supply is on, the control gate of the third device turns the third device off, the control gate of the second device turns the second device on which brings the control gate of the mechanism to ground and turns the mechanism on, which connects the substrate of the first device to the power supply, thereby allowing the current to flow from the first terminal of the first device to the second terminal of the first device through the channel of the first device.

25. The system of claim 24, wherein the mechanism includes a plurality of devices arranged in a series circuit, the series comprises:

a first device of the series circuit includes the first terminal of the mechanism, and the remainder of the devices of the series circuit each include a terminal which is connected to a substrate of the preceding adjacent device of the series circuit; and the last device in the series circuit includes the substrate of the mechanism, and the remainder of the devices of the series circuit each include a substrate which is connected to a terminal of the subsequent adjacent device of the series circuit.

26. The system of claim 25, wherein each device of the series circuit includes a control gate which is connected to the control gate of the first device.

27. The system of claim 24, wherein:

the control gate of the mechanism turns the mechanism off by pinching off the channel of the mechanism;

the control gate of the third device turns the third device off by pinching off a channel of the third device;

the control gate of the second device turns the second device off by pinching off a channel of the second device; and the control gate of the first device turns the first device off by pinching off the channel of the first device.

28. The system of claim 24, wherein:

the control gate of the mechanism turns the mechanism on by opening the channel of the mechanism;

the control gate of the third device turns the third device on by opening a channel of the third device;

the control gate of the second device turns the second device on by opening a channel of the second device; and the control gate of the first device turns the first device on by opening the channel of the first device.

29. The system of claim 24, wherein:

the current originates from a first chip that is remote from a second chip which includes the first device.

30. The system of claim 29, further comprising:

a fourth device including a first terminal that is connected to ground, and a second terminal that is connected to the first terminal of the first device;

wherein if the power supply is off, the fourth device terminates the current.

31. The system of claim 30, wherein:

the fourth device has an impedance that approximately matches an impedance of the first device when the power supply is on.

32. The system of claim 24, wherein:

the first device, the mechanism, and the third device comprise p-type field effect transistors; and the second device comprises a n-type field effect transistor.

33. A system for controlling an amount of a current flowing from a first terminal of a first device, wherein the device includes a control gate, a substrate a channel, and a second terminal which is connected to a power supply, the system comprising:

means for forming at least one pn diode in series with a pn diode formed from the first terminal of the first device and the substrate of the first device when the power supply is off, wherein a threshold voltage of the series exceeds a voltage associated with the current and prevents the current from flowing from the first terminal of the first device into the substrate of the first device;

means for connecting the power supply to the substrate of the first device when the power supply is on and allowing the current to flow from the first terminal of the first device to the second terminal of the first device through the channel of the first device;

means, operable if the power supply is on, for bringing a control gate of the first device to ground which turns the first device on, thereby allowing the current to flow from the first terminal of the first device to the second terminal of the first device through the channel of the first device; and means, operable if the power supply is off, for bringing the control gate of the first device to a voltage associated with the current which turns the first device off, thereby preventing the current from flowing from the first terminal of the first device to the second terminal of the first device through the channel of the first device.

34. The system of claim 33, wherein the means for forming at least one pn diode includes a plurality of devices arranged in a series circuit, the series circuit comprises:

a first device of the series circuit includes a terminal which is connected to the substrate of the first device, and the remainder of the devices of the series circuit each include a terminal which is connected to a substrate of the preceding adjacent device of the series circuit; and the last device in the series circuit includes a substrate which is connected to the power supply, and the remainder of the devices of the series circuit each include a substrate which is connected to a terminal of a subsequent adjacent device of the series circuit;

wherein each of the devices forms a pn diode from its respective terminal and substrate.

35. The system of claim 34, wherein each device of the series circuit includes a control gate which is connected to the control gate of the first device.

36. The system of claim 33, wherein:

the control gate of the first device turns the first device off by pinching off the channel of the first device.

37. The system of claim 33, wherein:

the control gate of the first device turns the first device on by opening the channel of the first device.

38. The system of claim 33, wherein:

the current originates from a first chip that is remote from a second chip which includes the first device.

39. The system of claim 38, further comprising:

means for terminating the current when the power supply is off.

40. The system of claim 39, wherein:

the means for terminating the current has an impedance that approximately matches an impedance of the first device when the power supply is on.

41. The system of claim 32, wherein:

the first device, the means for forming at least one pn diode, and the means for bringing the control gate of the first device to a voltage associated with the current comprise p-type field effect transistors; and the means for bringing the control gate of the first device to ground comprises a n-type field effect transistor.

42. A method for controlling an amount of a current flowing from a first terminal of a first device, wherein the device includes a control gate, a substrate, a channel, and a second terminal which is connected to a power supply, the method comprising the steps of:

forming at least one pn diode in series with a pn diode formed from the first terminal of the first device and the substrate of the first device, if the power supply is off, wherein a threshold voltage of the series exceeds a voltage associated with the current and prevents the current from flowing from the first terminal of the first device into the substrate of the first device;

connecting the power supply to the substrate of the first device, if the power supply is on, and allowing the current to flow from the first terminal of the first device to the second terminal of the first device through the channel of the first device;

bringing a control gate of the first device to ground, if the power supply is on, and turning the first device on, thereby allowing the current to flow from the first terminal of the first device to the second terminal of the first device through the channel of the first device; and bringing the control gate of the first device to a voltage associated with the current, if the power supply is off, and turning the first device off, thereby preventing the current from flowing from the first terminal of the first device to the second terminal of the first device through the channel of the first device.

43. The method of claim 42, wherein the step of forming at least one pn diode comprises the step of forming a series circuit from a plurality of devices, the step of forming the series circuit comprises the steps of:

providing a first device in the series circuit which includes a terminal which is connected to the substrate of the first device, and the remainder of the devices of the series circuit which each include a terminal that is connected to a substrate of the preceding adjacent device of the series circuit; and providing a last device in the series circuit which includes a substrate which is connected to the power supply, and the remainder of the devices of the series circuit which each include a substrate that is connected to a terminal of a subsequent adjacent device of the series circuit;

wherein each of the devices forms a pn diode from its respective terminal and substrate.

44. The system of claim 42, wherein:

the current originates from a first chip that is remote from a second chip which includes the first device.

45. The system of claim 44, further comprising the step of:

terminating the current when the power supply is off.

46. The system of claim 45, wherein the step of terminating comprises the step of:

matching, approximately, an impedance of the first device when the power supply is on.

* * * * *